United States Patent [19]
Hsu

[11] Patent Number: 5,910,667
[45] Date of Patent: Jun. 8, 1999

[54] STRUCTURE FOR A STACKED DRAM CAPACITOR

[75] Inventor: Chen-Chung Hsu, Taichung, Taiwan

[73] Assignee: United Microelectronics Corp., Taiwan, China

[21] Appl. No.: 08/890,303

[22] Filed: Jul. 9, 1997

[30] Foreign Application Priority Data

Apr. 2, 1997 [TW] Taiwan ................................. 86104246

[51] Int. Cl.$^6$ ................................................ H01L 29/00
[52] U.S. Cl. .................... 257/306; 257/296; 257/301; 257/303; 257/308
[58] Field of Search .................................. 257/296, 301, 257/303, 306, 308

[56] References Cited

U.S. PATENT DOCUMENTS

| | | | |
|---|---|---|---|
| 5,077,688 | 12/1991 | Kumanoya et al. | 365/149 |
| 5,168,336 | 12/1992 | Mikoshiba | 257/303 |
| 5,457,334 | 10/1995 | Nishimoto | 257/306 |
| 5,662,768 | 9/1997 | Rostoker | 257/301 |
| 5,696,395 | 12/1997 | Tseng | 257/308 |
| 5,783,848 | 7/1998 | Chao | 257/296 |

Primary Examiner—Valencia Martin-Wallace
Attorney, Agent, or Firm—Finnegan, Henderson, Farabow, Garrett & Dunner, L.L.P.

[57] ABSTRACT

A DRAM capacitor structure and its manufacturing method which includes providing a semiconductor substrate with a MOS transistor already formed above, and that the MOS transistor includes a gate and source/drain regions, then forming a first insulating layer covering the semiconductor substrate, next forming a multi-layered structure with at least one pair of alternately formed second insulating layer followed by a third insulating layer above the first insulating layer, subsequently forming an opening through the multi-layered structure and the first insulating layer exposing the source/drain region below, thereafter etching and defining a pattern on the multi-layered structure so as to expose part of the first insulating layer, this is followed by etching the second insulating layer and forming a plurality of trenches in a horizontal direction on the sidewalls of the multi-layered structure, and then forming a lower electrode layer covering the surfaces of the multi-layered structure as well as the exposed surface of the source/drain region, after that forming a dielectric layer over the lower electrode layer, and finally forming an upper electrode layer over the dielectric layer.

11 Claims, 10 Drawing Sheets

STRUCTURE FOR A STACKED DRAM CAPACITOR

BACKGROUND OF THE INVENTION

1. Field of the Invention

This invention relates to a structure and manufacturing method for dynamic random-access-memory (DRAM) capacitors, and, more particularly, to such a structure and manufacturing method for a stacked type capacitor as well as an improved version using a combination of stacked and trench type capacitors.

2. Description of Related Art

Figure 1:
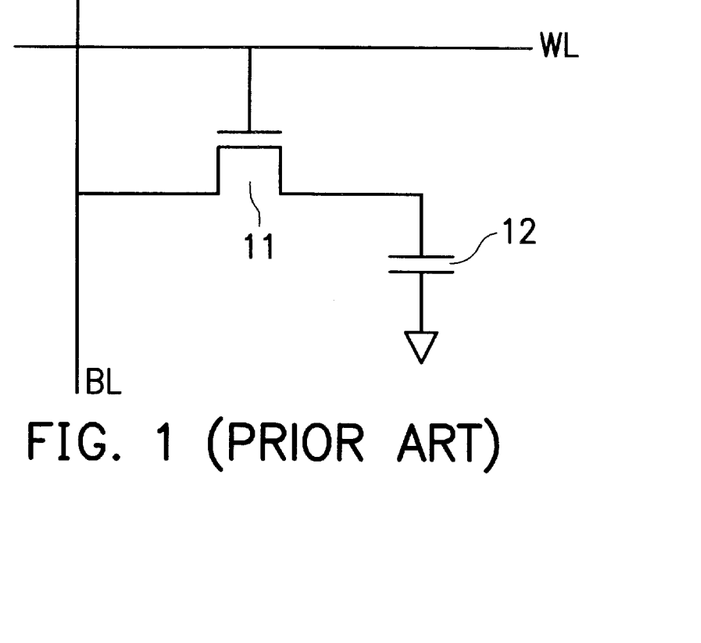
FIG. 1 is a circuit diagram for DRAM cell.

DRAM is a kind of volatile memory in which a digital signal is stored according to the charging state of the capacitor in each memory cell. FIG. 1 shows a circuit diagram of a DRAM cell, which includes a metal-oxide-semiconductor (MOS) transistor 11 with its gate connected to a word line (WL), one end of a source/drain region connected to a bit line (BL) while the other source/drain region connected to ground via a capacitor 12. The capacitor 12 can be regarded as the heart for the storage of digital signals in a DRAM cell. When the size of the charge stored in the capacitor 12 increases, the storage capacity for digital signals must also be increased. Furthermore, the signal read-out from the memory by amplification circuits during a read operation will be less affected by noise, for example, soft errors generated by a-particles will be greatly reduced.

Several conventional methods presently exist for increasing the charge storage capacity of the capacitor. For example, by increasing the surface area of the conducting layer in a capacitor or reducing the thickness of the dielectric layer in a capacitor, the quantity of charges capable of being stored in the capacitor can be increased. The stacked type capacitor as shown in FIG. 2 is one such example of a capacitor structure having an increased capacitor area.

Figure 2:
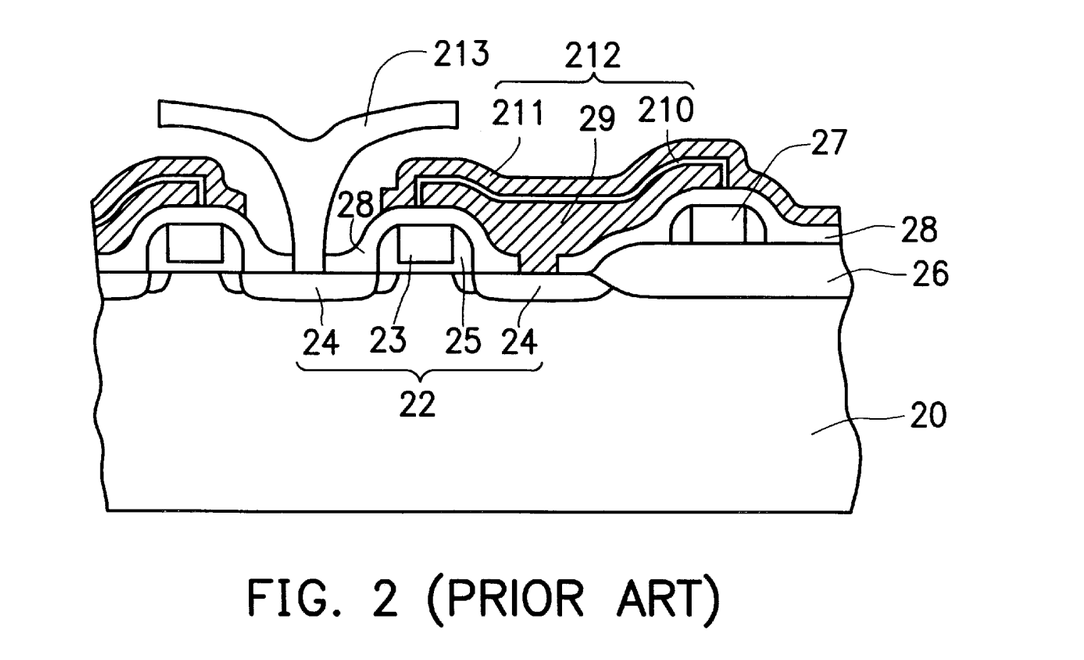
FIGS. 2 through 4 are cross-sectional views showing three kinds of conventional stacked DRAM capacitor structures.

FIG. 2 is a cross-sectional view showing a conventional stacked type DRAM capacitor structure. First, a semiconductor substrate 20 having a MOS transistor 22, a field oxide layer 26 and a conducting layer 27 is provided. The MOS transistor 22 includes a gate 23, source/drain regions 24 and spacers 25. Then, an insulating layer 28 is deposited, followed by etching of the insulating layer 28, to form contact openings above designated source/drain regions 24. Thereafter, a lower electrode layer 29, a dielectric layer 210 and an upper electrode layer 211 are sequentially formed above the contact window, providing a stacked type capacitor structure 212. The dielectric layer 210 can be a silicon nitride/silicon oxide (NO) composite layer or a silicon oxide/silicon nitride/silicon oxide (ONO) composite layer. The lower electrode layer 29 and the upper electrode layer 211 can each be a polysilicon layer. Finally, back-end processes such as the formation of a metallic contact window 213 and the laying of a passivation layer (not shown in FIG. 2) are performed to complete the remaining structural fabrication of the DRAM.

Figure 3:
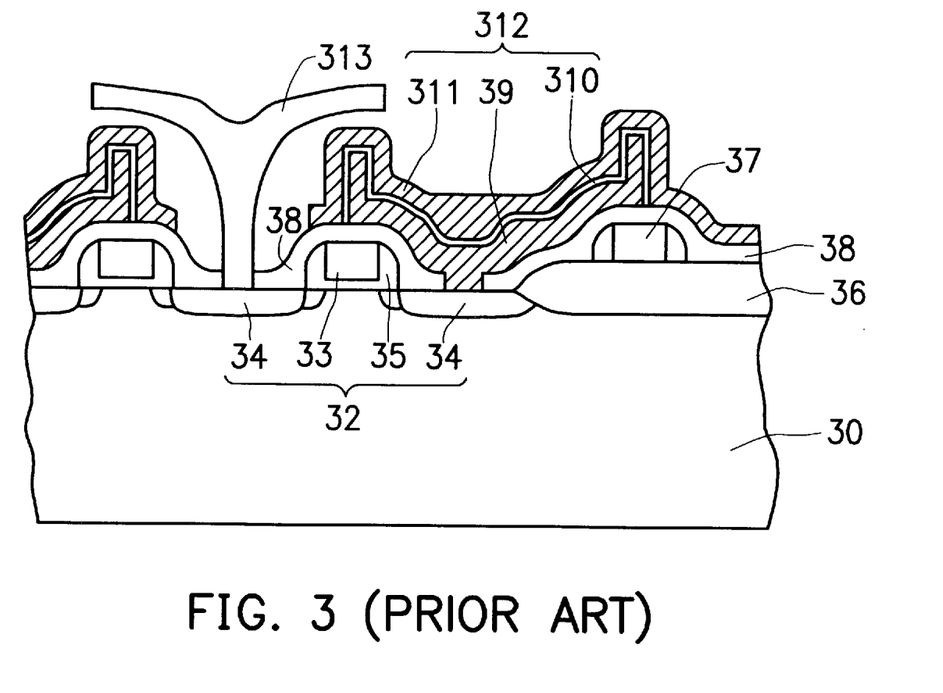

FIG. 3 is a cross-sectional view showing a second conventional stacked type DRAM capacitor structure. First, a semiconductor substrate 30 having a MOS transistor 32, a field oxide layer 36 and a conducting layer 37 is provided. The MOS transistor 32 includes a gate 33, source/drain regions 34 and spacers 35. Then, an insulating layer 38 is deposited, followed by the etching of the insulating layer 38, to form contact openings above designated source/drain regions 34. Thereafter, a lower electrode layer 39, a dielectric layer 310 and an upper electrode layer 311 are sequentially formed above the contact window to provide a stacked type capacitor structure 312. The dielectric layer 310 can be a silicon nitride/silicon oxide (NO) composite layer or a silicon oxide/silicon nitride/silicon oxide (ONO) composite layer. The lower electrode layer 39 and the upper electrode layer 311 can each be a polysilicon layer, and shaped such that the lower electrode layer 39 has an irregular rise and fall surface profile. Finally, back-end processes such as the formation of a metallic contact window 313 and the laying of passivation layer (not shown in FIG. 3) are performed to complete the remaining structural fabrication of the DRAM.

Figure 4:
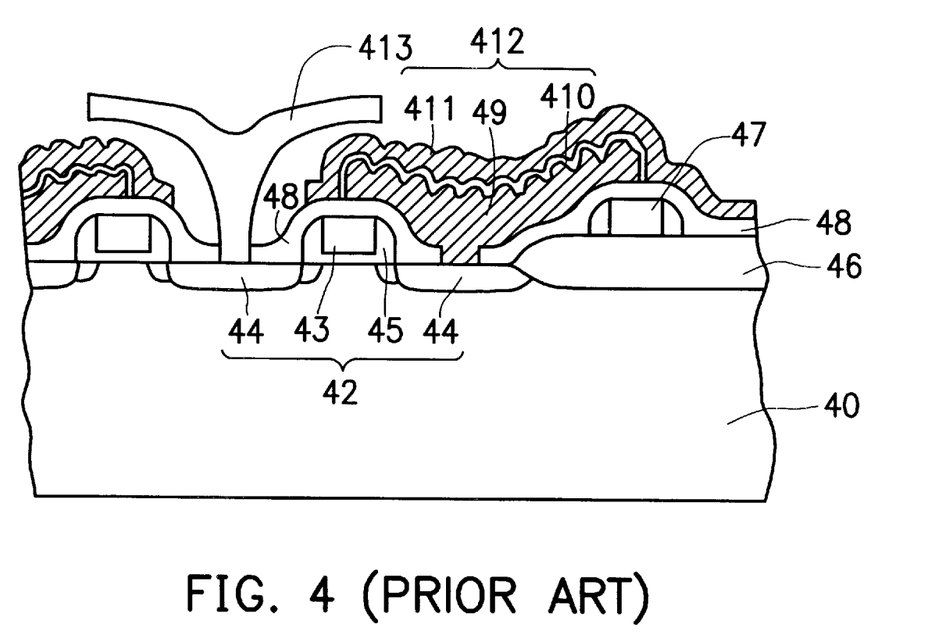

FIG. 4 is a cross-sectional view showing a third conventional stacked type DRAM capacitor structure. First, a semiconductor substrate 40 having a MOS transistor 42, a field oxide layer 46 and a conducting layer 47 is provided. The MOS transistor 42 includes a gate 43, source/drain regions 44 and spacers 45. Then, an insulating layer 48 is deposited, followed by the etching of the insulating layer 48, to form contact openings above designated source/drain regions 44. Thereafter, a lower electrode layer 49, a dielectric layer 410 and an upper electrode layer 411 are sequentially formed above the contact window, to provide a stacked type capacitor structure 412. The dielectric layer 410 can be a silicon nitride/silicon oxide (NO) composite layer or a silicon oxide/silicon nitride/silicon oxide (ONO) composite layer. The lower electrode layer 49 and the upper electrode layer 411 can each be a polysilicon layer, and that the lower electrode layer 49 has an undulating surface profile serving to increase the surface area of the capacitor 412. Finally, back-end processes such as the formation of a metallic contact window 413 and the laying of passivation layer (not shown in FIG. 4) are performed to complete the remaining structural fabrication of the DRAM.

The aforementioned stacked type capacitor structures are the most common capacitor structures for DRAMs in use at present. These methods all rely on improving the surface morphology of capacitors. Although the increase in surface area of a capacitor obtained by such methods is capable of increasing its capacitance, the main drawback is that the amount of increase is quite limited, and is ineffective when applied to components of small dimensions.

SUMMARY OF THE INVENTION

It is therefore an object of this invention to provide a DRAM capacitor structure and manufacturing method that can greatly increase the surface area of the capacitor and thus effectively raise its capacitance, and moreover, is suitable in applications involving components having small dimensions.

The advantages and purpose of the invention will be set forth in part in the description which follows, and in part will be obvious from the description, or may be learned by practice of the invention. The advantages and purpose of the invention will be realized and attained by means of the elements and combinations particularly pointed out in the appended claims.

To attain the advantages and in accordance with the purpose of the invention, as embodied and broadly described herein, the invention provides a stacked DRAM capacitor structure on top of a MOS transistor having a gate and source/drain regions, and having an annular insulating structure of a vertical stacked-T-shaped cross-sectional profile with a central opening exposed to the source/drain region of the MOS transistor. A lower electrode covers the exposed surfaces of the annular insulating structure and the source/drain region, and an upper electrode is separated from the lower electrode by an intermediate dielectric layer.

In another aspect, the advantages and purpose of the invention are attained by a manufacturing method for making stacked DRAM capacitors, comprising the steps of:

(a) providing a semiconductor substrate with a MOS transistor, the MOS transistor including a gate and source/drain regions;

(b) forming a first insulating layer to cover the semiconductor substrate;

(c) forming on the first insulating layer a multi-layered structure with at least one pair of alternately formed second insulating layers, each followed by a third insulating layer;

(d) forming an opening through the multi-layered structure and the first insulating layer to expose the source/drain region;

(e) etching and defining a pattern on the multi-layered structure with the first insulating layer as an etching stop layer;

(f) etching the second insulating layers such that only part of each second insulating layer remains between the third insulating layers, and forming a plurality of horizontal trenches in the sidewalls of the multi-layered structure, creating a vertical stacked-T-shaped cross-sectional profile;

(g) forming a lower electrode layer covering the surfaces of the multi-layered structure as well as the exposed surface of the source/drain region;

(h) forming a dielectric layer over the lower electrode layer; and (i) forming an upper electrode layer over the dielectric layer.

It is to be understood that both the foregoing general description and the following detailed description are exemplary and explanatory only and are notrestrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the principles of the invention. In the drawings.

DESCRIPTION OF THE PREFERRED EMBODIMENT

Reference will now be made in detail to the present preferred exemplary embodiments of the invention, examples of which are illustrated in the accompanying drawings. Wherever possible, the same reference numbers will be used throughout the drawings to refer to the same or like parts.

FIGS. 5A through 5G are a series of cross-sectional views outlining the manufacturing steps for a stacked type DRAM capacitor according to one preferred embodiment of this invention.

Figure 5A:
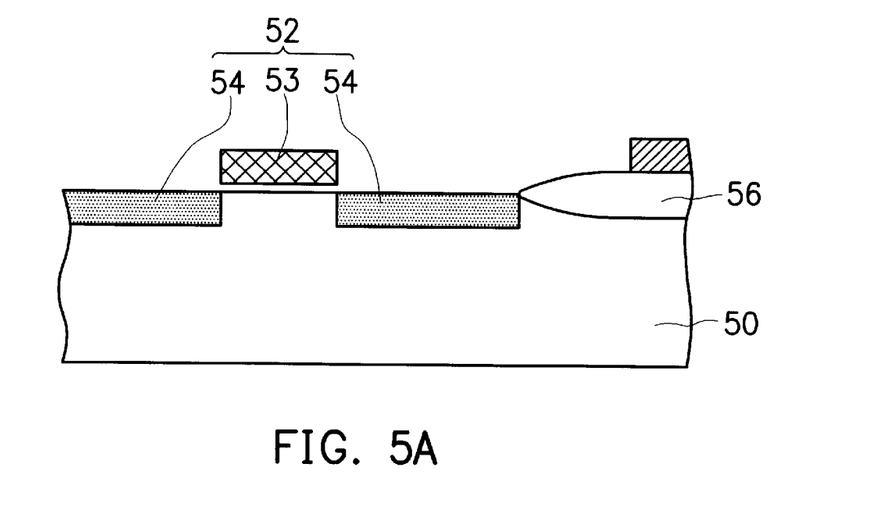
FIGS. 5A through 5G are a series of cross-sectional views outlining the manufacturing steps for a stacked type DRAM capacitor according to one preferred embodiment of this invention.

As shown in FIG. 5A, a semiconductor substrate 50 having a MOS transistor 52 and a field oxide layer 56 is provided. The MOS transistor 52, itself, has a gate 53 and source/drain regions 54.

Figure 5B:
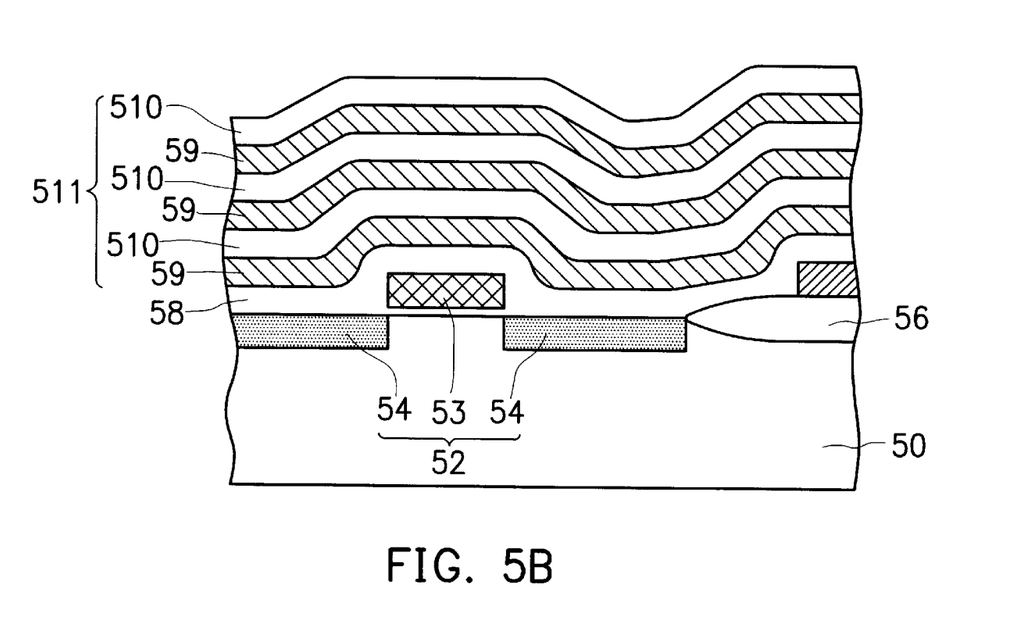

Next, as shown in FIG. 5B, a first insulating layer 58, preferably a silicon dioxide layer with a thickness of about 3000 Å to 6000 Å is deposited above the semiconductor substrate 50 using tetra-ethyl-ortho-silicate (TEOS) as the reactive gas. Thereafter, a multi-layered stack with at least one pair of alternately deposited second insulating layer 59, each followed by a third insulating layer 510, is formed above the first insulating layer 58. The second insulating layer 59 is preferably a nitride layer with a thickness of about 3000 Å to 6000 Å while the third insulating layer 510 is preferably a silicon dioxide layer with a thickness of about 3000 Å to 6000 Å.

Figure 5C:
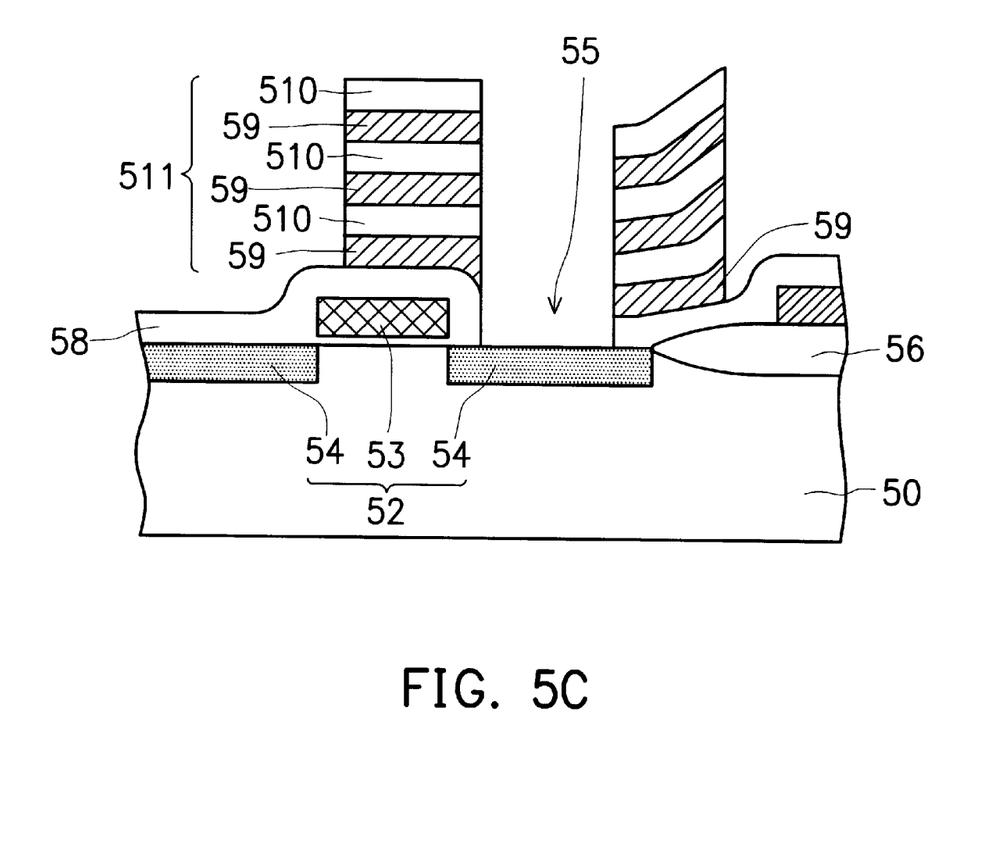

As shown in FIG. 5C, in the subsequent step, an anisotropic dry etching method is used to etch the multi-layered structure 511 and the first insulating layer 58, forming an opening 55 that exposes one of the source/drain regions 54. Thereafter, a pattern is defined on the multi-layered structure 511, and, using the first insulating layer 58 as a etching stop layer, etching the multi-layered structure 511 to provide an annular structure having an open center.

Figure 5D:
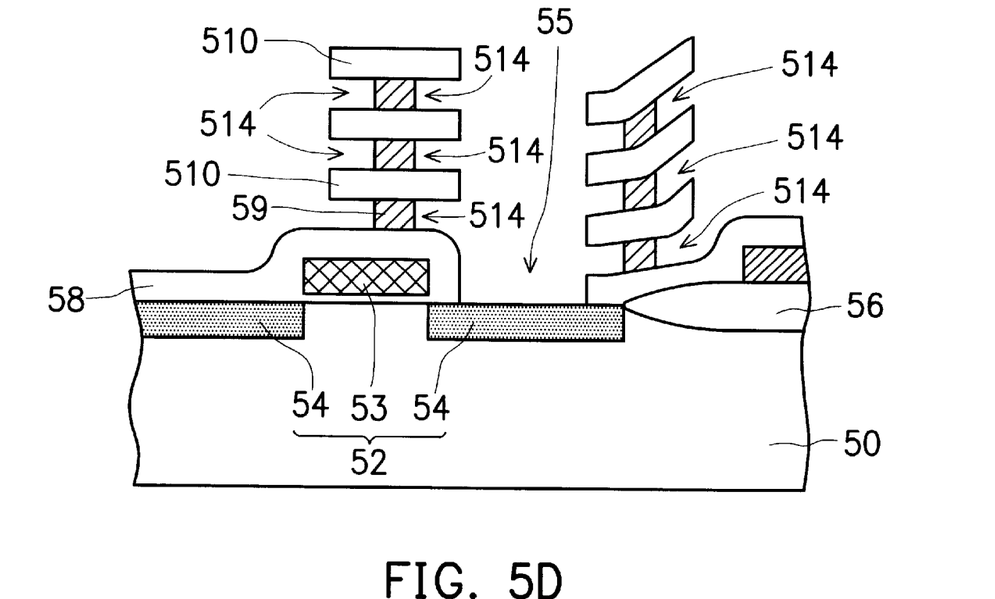

Then, as shown in FIG. 5D, using hot phosphoric acid (H3PO4) as the etchant, a wet etching method is used to remove part of the second insulating layers 59 to form a plurality of trenches 514 in the horizontal direction on the sidewalls of the multi-layered structure 511, creating a multi-layered structure 511 having a stacked-T-shaped radial cross-sectional profile.

Figure 5E:
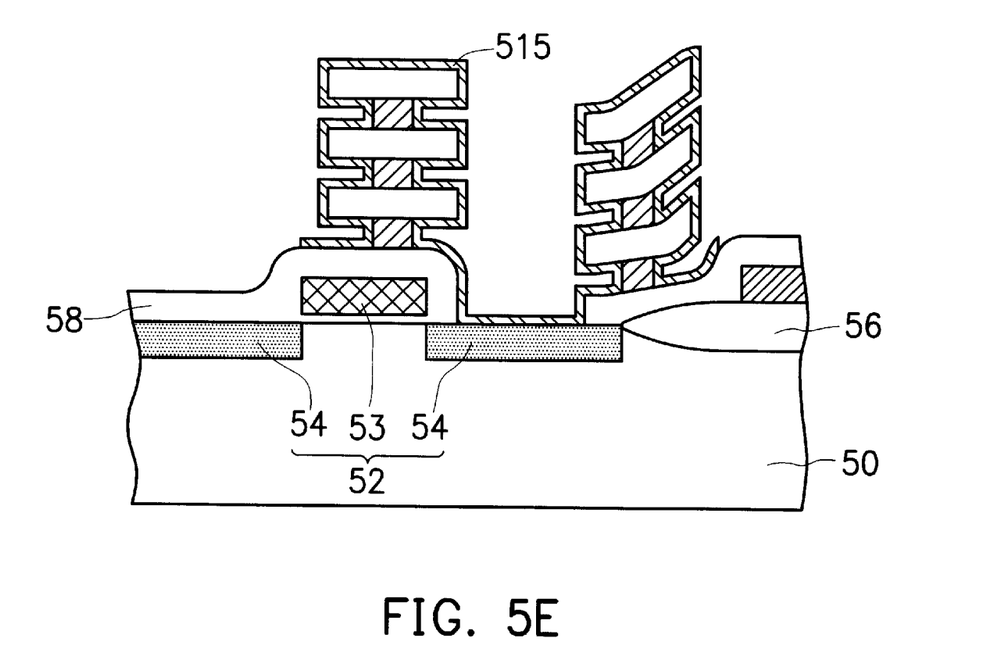

As shown in FIG. 5E, in the subsequent step, a lower electrode layer 515, for example, a doped polysilicon layer, with a thickness of about 500 Å to 2000 Å is deposited over the surface of the multi-layered structure 511 and the exposed surface of the semiconductor substrate 50. The polysilicon layer can be deposited by chemical vapor deposition with embedded doping ions for increasing electrical conductivity.

Figure 5F:
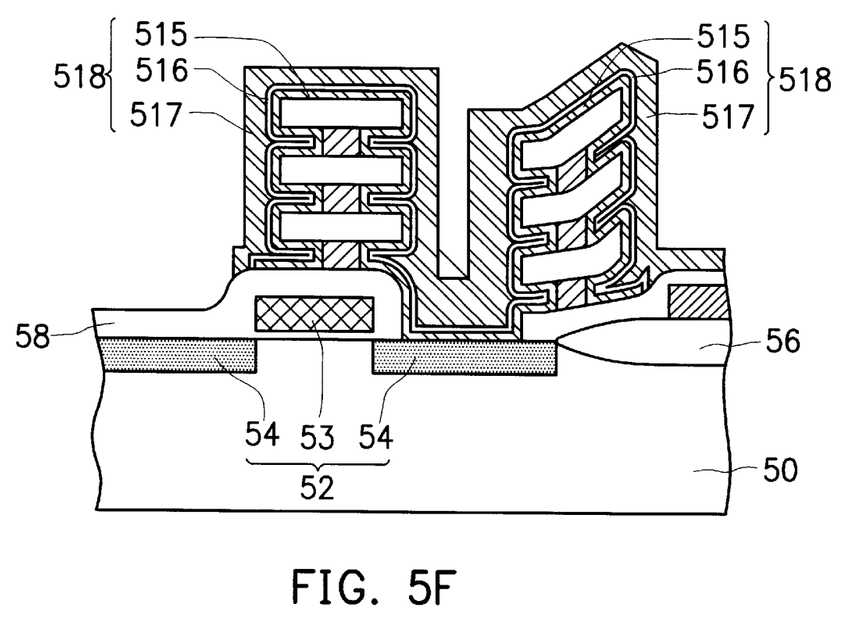

Subsequently, as shown in FIG. 5F, a dielectric layer 516, for example, a silicon oxide/silicon nitride/silicon oxide (ONO) composite layer, is deposited on the lower electrode layer 515. The ONO composite layer can be formed by first heat growing a silicon oxide layer, then forming a silicon nitride layer on top, and finally performing a thermal oxidation process to form a silicon oxide layer above the silicon nitride layer. Thickness for the dielectric layer 516 is normally smaller than the thickness of the lower electrode layer 515, and in general should not be greater than about 100 Å. Next, an upper electrode layer 517, for example, a doped polysilicon layer, with a thickness of about 1000 Å to 3000 Å is deposited on the dielectric layer 516. The polysilicon layer can be deposited by chemical vapor deposition with embedded doping ions for increasing electrical conductivity. Thereafter, the lower electrode layer 515, the dielectric layer 516 and the upper electrode layer 517 are etched to define an overall pattern for the capacitor 518.

Hence, the lower electrode layer 515, the dielectric layer 516 and the upper electrode layer 517 together provide a stacked DRAM capacitor structure 518.

Figure 5G:
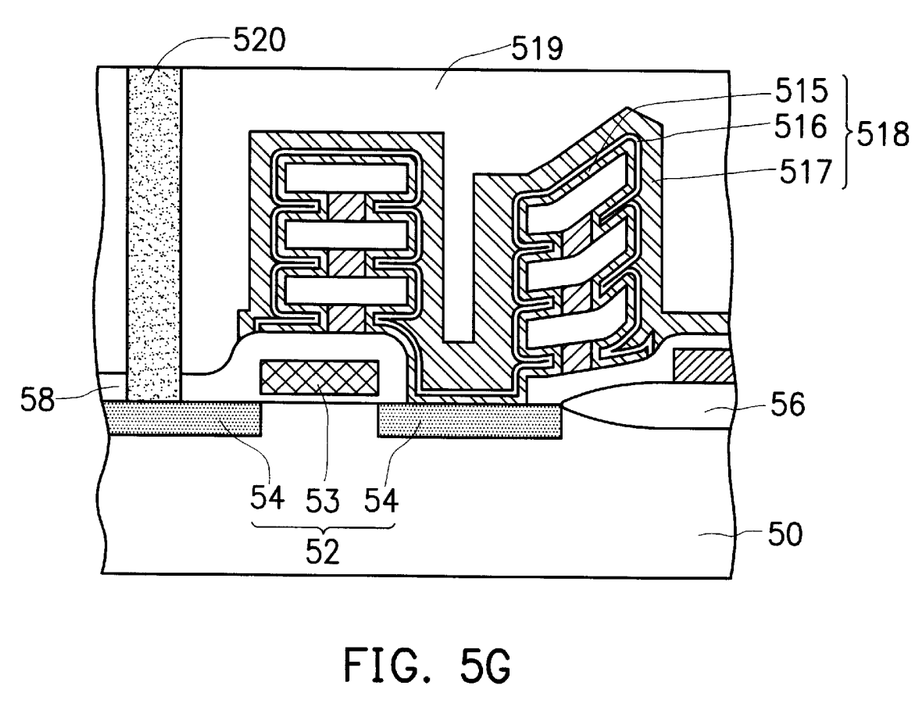

Lastly, as shown in FIG. 5G, subsequent back end processes are performed, such as depositing a fourth insulating layer 519 followed by the formation of a metal interconnect 520 in order to complete the DRAM structure of the first embodiment of this invention.

FIGS. 6A through 6G are a series of cross-sectional views outlining the manufacturing steps for a DRAM capacitor according to a second preferred embodiment of this invention. The capacitor in this embodiment is a combination of trench type and stacked type capacitors.

Figure 6A:
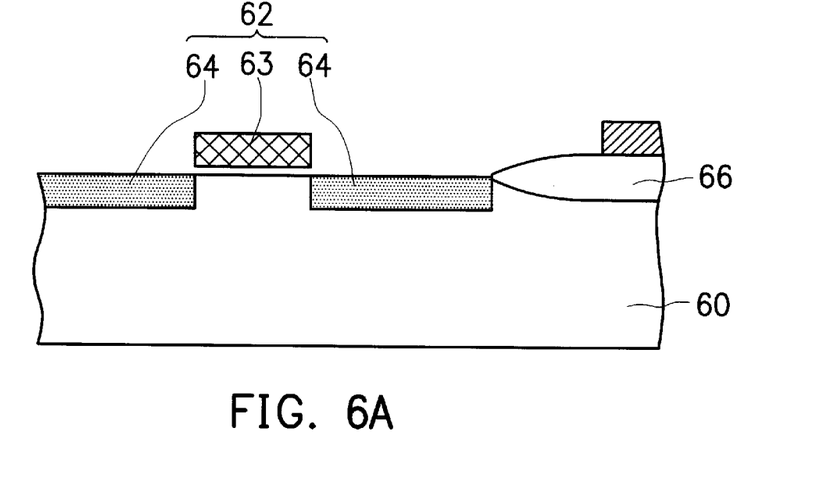
FIGS. 6A through 6G are a series of cross-sectional views outlining the manufacturing steps for a DRAM capacitor according to a second preferred embodiment of this invention.

First, as shown in FIG. 6A, a semiconductor substrate 60 having a MOS transistor 62 and a field oxide layer 66 is provided. The MOS transistor 62, itself, has a gate 63 and source/drain regions 64.

Figure 6B:
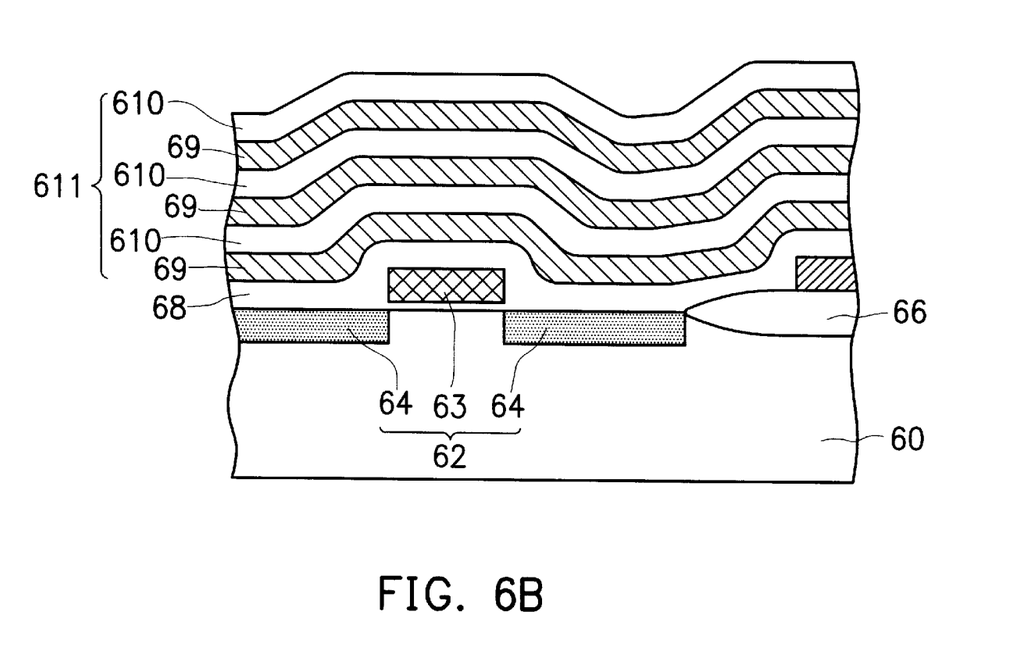

Next, in FIG. 6B, a first insulating layer 68, preferably a silicon dioxide layer with a thickness of about 3000 Å to 6000 Å is deposited on the semiconductor substrate 60 using tetra-ethyl-ortho-silicate (TEOS) as the reactive gas. Thereafter, a multi-layered stack with at least one pair of alternately deposited second insulating layer 69, each followed by a third insulating layer 610, is formed above the first insulating layer 68. The second insulating layer 69 is preferably a nitride layer with a thickness of about 3000 Å to 6000 Å, while the third insulating layer 610 is preferably a silicon dioxide layer with a thickness of about 3000 Å to 6000 Å.

Figure 6C:
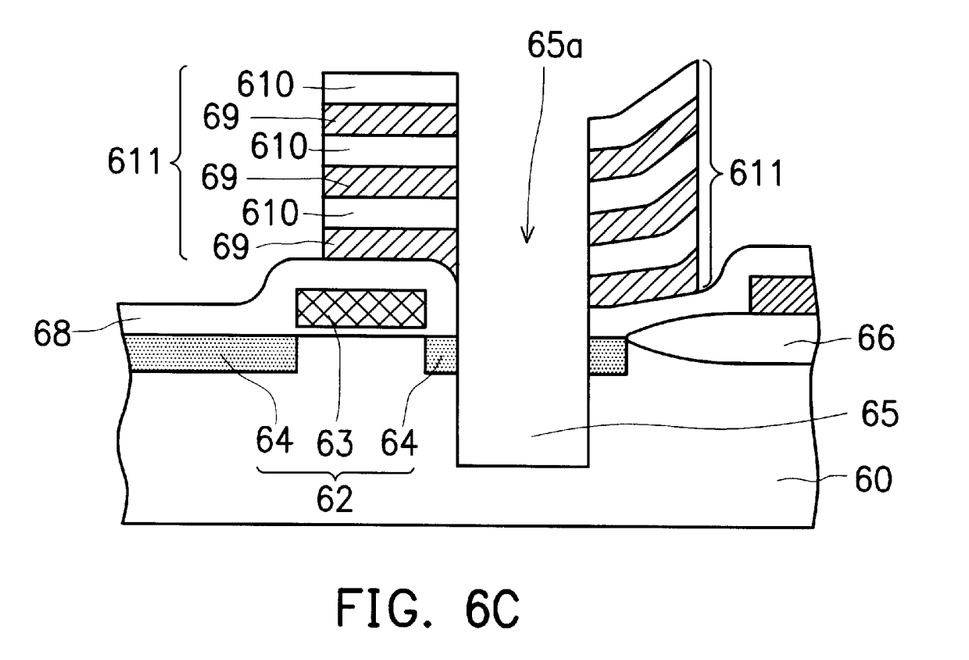

In FIG. 6C, depicting a subsequent step, an anisotropic dry etching method is used to etch the multi-layered structure 611 and the first insulating layer 68, forming an opening 65a. Then, etching is continued downward to form a first trench 65. Thereafter, a pattern is etched on the multi-layered structure 611, using the first insulating layer 68 as a etching stop layer, to form a multi-layered structure 611 having an annular structure.

Figure 6D:
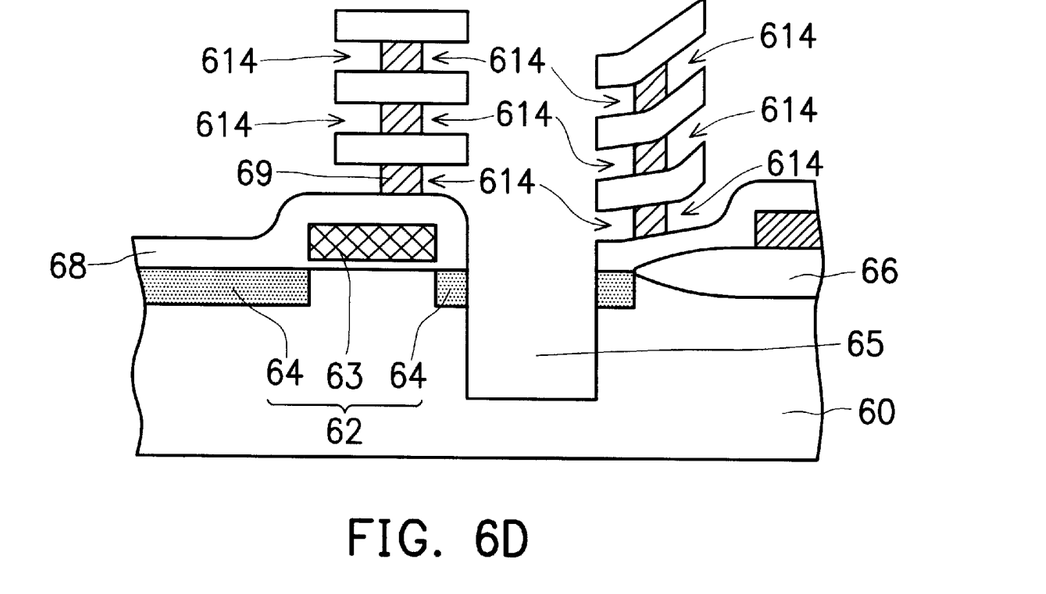

As shown next in FIG. 6D, using hot phosphoric acid (H3PO4) as the etchant, a wet etching method is used to remove part of the second insulating layers 69 to form a plurality of second trenches 614 horizontally in the sidewalls of the multi-layered structure 611, creating a multi-layered structure 611 having a stacked-T-shaped radial cross-sectional profile.

Figure 6E:
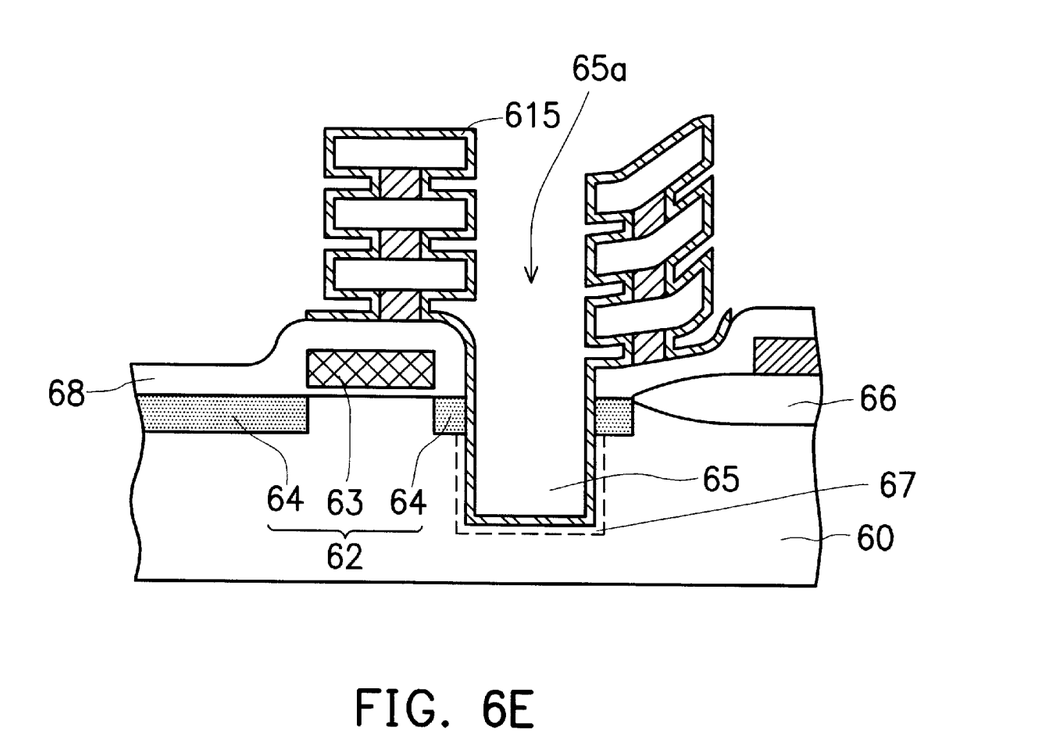

In FIG. 6E, representing a subsequent step, a lower electrode layer 615, for example, a doped polysilicon layer, with a thickness of about 500 Å to 2000 Å, is deposited on the surface of the multi-layered structure 611 and the exposed surface of the semiconductor substrate 60. The polysilicon layer can be deposited by chemical vapor deposition with embedded doping ions for increasing electrical conductivity. An annealing operation is then performed to activate the ions previously doped within the lower electrode layer 615 to generate a diffusion region 67 at the bottom of the first trench 65, as shown by the dash line in FIG. 6E. The diffusion region 67 can be made to connect with the source/drain region 64 so that the source drain region 64 will not be separated into two separate regions as a result of the formation of the first trench 65.

Figure 6F:
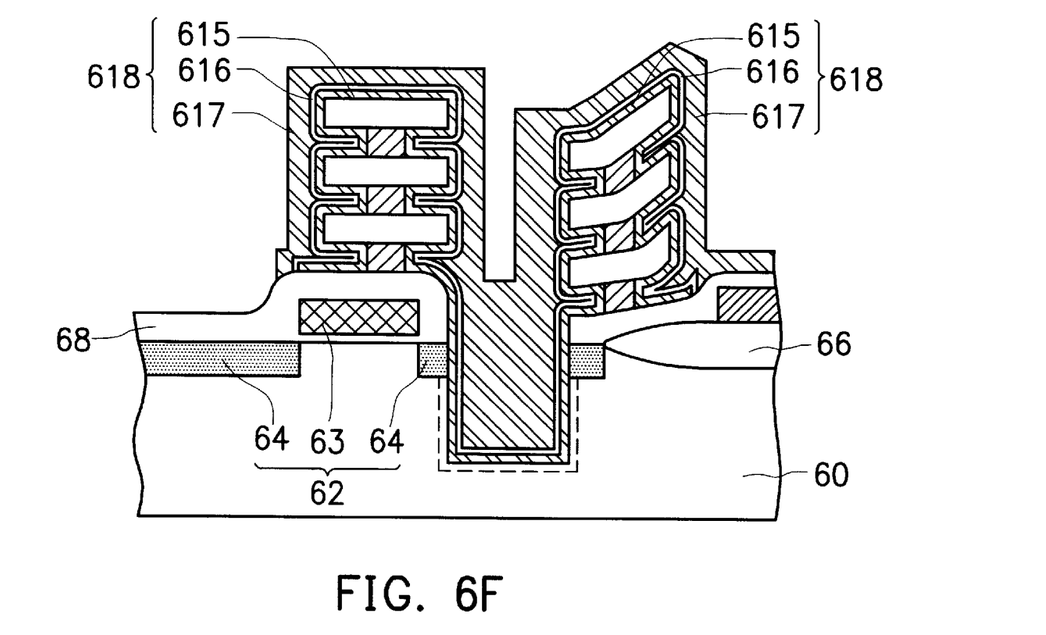

Subsequently, as shown in FIG. 6F, a dielectric layer 616, for example, a silicon oxide/silicon nitride/silicon oxide (ONO) composite layer, is deposited on the lower electrode layer 615. The ONO composite layer can be formed by first heat growing a silicon oxide layer, then forming a silicon nitride layer on top, and finally performing a thermal oxidation process to form a silicon oxide layer above the silicon nitride layer. Thickness for the dielectric layer 616 is normally smaller than the thickness of the lower electrode layer 615, and in general should not be greater than about 100 Å. Next, an upper electrode layer 617, for example, a doped polysilicon layer, with a thickness of about 1000 Å to 3000 Å is deposited above the dielectric layer 616. The polysilicon layer can be formed by chemical vapor deposition with doping ions embedded for increasing the electrical conductivity. Thereafter, the lower electrode layer 615, the dielectric layer 616 and the upper electrode layer 617 are etched to define the overall pattern of the capacitor 618. Hence, the lower electrode layer 615, the dielectric layer 616 and the upper electrode layer 617 together provide a stacked DRAM capacitor structure 618.

Figure 6G:
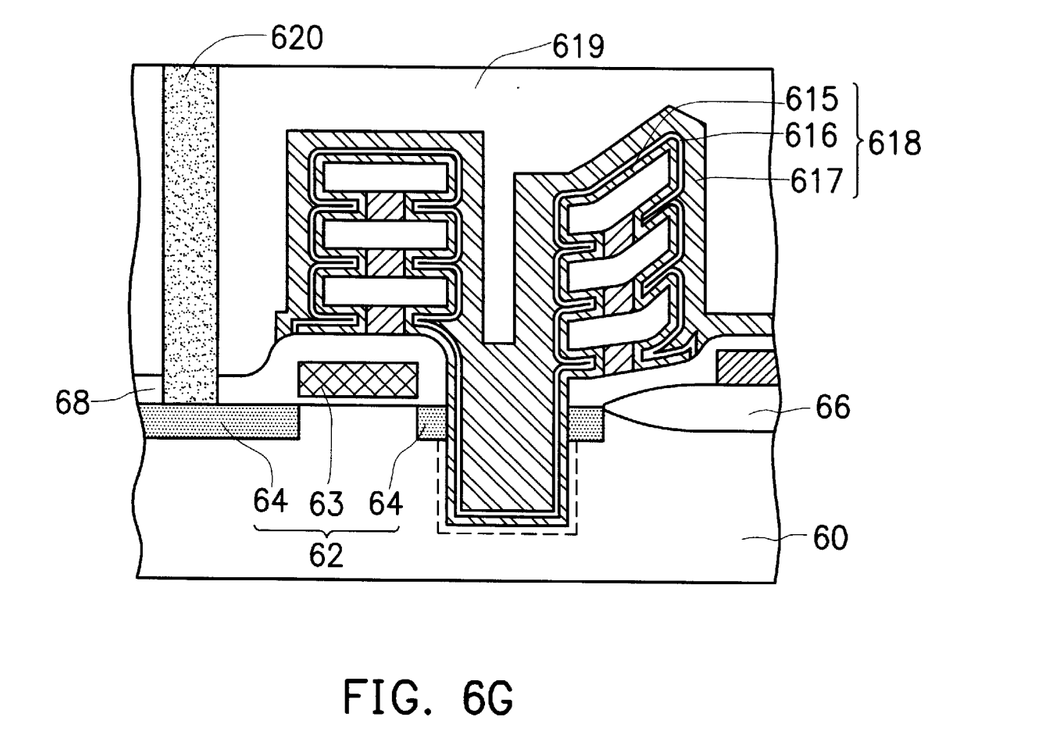

Lastly, as shown in FIG. 6G, subsequent back end processes are performed, such as depositing a fourth insulating layer 619, followed by the formation of a metal interconnect 620, to complete the DRAM structure according the second embodiment of the invention.

The manufacturing method for DRAM capacitor suggested in this invention has the following advantages:

(1) The multi-layered structure formed by alternately depositing a second insulating layer 59 (69) and a third insulating layer 510 (610) can greatly increase the surface area of the capacitor, making a substantial increase in the amount of charges capable of being stored in a capacitor.

(2) The manufacturing method for producing the capacitor structure in this invention requires fewer steps than methods for producing other conventional capacitor structures, and therefore has lower production cost and production time.

(3) Trench type capacitors as well as stacked type capacitors can be used together in the same capacitor design according to this invention. Such flexibility allows a great increase in the surface area of the capacitor and hence its charge storage capacity.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A stacked DRAM capacitor structure on top of a MOS transistor having a gate region and a source/drain region, comprising:

(a) an annular insulating structure having a radial cross-sectional profile shaped as a plurality of vertically stacked T's, and a central opening exposed to the source/drain region of the MOS transistor;

(b) a lower electrode covering the exposed surfaces of the annular insulating structure and above the source/drain region; and (c) an upper electrode separated from the lower electrode by an intermediate dielectric layer.

2. A structure according to claim 1, wherein the central opening of the annular insulating structure extends to a trench that penetrates into the source/drain region and wherein the lower electrode, the dielectric layer and the upper electrode also extend into the trench.

3. A stacked DRAM capacitor structure on top of a MOS transistor having a gate region and a source/drain region, comprising:

(a) an annular insulating structure having a vertical stacked-T-shaped cross-sectional profile and a central opening exposed to the source/drain region of the MOS transistor, the annular insulating structure including a plurality of first insulating layers and a plurality of second insulating layers, the plurality of first insulating layers and the plurality of second insulating layers being stacked alternately, each of the plurality of second insulating layers being sandwiched and lying completely within two of the plurality of first insulating layers, (b) a lower electrode covering the exposed surfaces of the annular insulating structure and above the source/drain region; and (c) an upper electrode separated from the lower electrode by an intermediate dielectric layer.

4. A structure according to claim 3, wherein the first insulating layers include a silicon dioxide layer.

5. A structure according to claim 3, wherein the thickness of each of the first insulating layers is about 3000 Å to 6000 Å.

6. A structure according to claim 3, wherein the second insulating layers include a nitride layer.

7. A structure according to claim 3, wherein the thickness of each of the second insulating layers is about 3000 Å to 6000 Å.

8. A structure according to claim 1, wherein the lower electrode includes a doped polysilicon layer.

9. A structure according to claim 1, wherein the thickness of the lower electrode layer is about 500 Å to 2000 Å.

10. A structure according to claim 1, wherein the upper electrode includes a doped polysilicon layer.

11. A structure according to claim 1, wherein the thickness of the upper electrode layer is about 1000 Å to 3000 Å.

* * * * *